United States Patent
Parker-Swift et al.

(10) Patent No.: US 11,705,858 B2
(45) Date of Patent: Jul. 18, 2023

(54) SOLAR ELECTRICAL GENERATOR

(71) Applicant: Solivus Limited, Surrey (GB)

(72) Inventors: Jo Parker-Swift, Kent (GB); James Baker, Toft (GB); Ben Crundwell, Toft (GB)

(73) Assignee: SOLIVUS LIMITED, Surrey (GB)

( * ) Notice: Subject to any disclaimer, the term of this patent is extended or adjusted under 35 U.S.C. 154(b) by 118 days.

(21) Appl. No.: 17/270,383

(22) PCT Filed: Aug. 20, 2019

(86) PCT No.: PCT/GB2019/052335
§ 371 (c)(1),
(2) Date: Feb. 22, 2021

(87) PCT Pub. No.: WO2020/039181
PCT Pub. Date: Feb. 27, 2020

(65) Prior Publication Data
US 2021/0257965 A1    Aug. 19, 2021

(30) Foreign Application Priority Data

Aug. 24, 2018 (GB) .................................. 1813878

(51) Int. Cl.
| | |
|---|---|
| H02S 20/32 | (2014.01) |
| H02S 10/12 | (2014.01) |
| H02S 40/22 | (2014.01) |
| H02S 40/38 | (2014.01) |
| H01L 31/0392 | (2006.01) |

(52) U.S. Cl.
CPC ........ *H02S 20/32* (2014.12); *H01L 31/03926* (2013.01); *H02S 10/12* (2014.12); *H02S 40/22* (2014.12); *H02S 40/38* (2014.12)

(58) Field of Classification Search
CPC ....... H01L 31/00–078; Y02E 10/50–60; H02S 20/00–32; H02S 30/00–20; H02S 40/00–44
USPC ................................................. 136/243–265
See application file for complete search history.

(56) References Cited

U.S. PATENT DOCUMENTS

| | | | |
|---|---|---|---|
| 6,060,658 A * | 5/2000 | Yoshida | G09F 13/02 52/173.3 |
| 7,453,167 B2 | 11/2008 | Gilbert | |
| 2005/0084373 A1 | 4/2005 | Suzuki | |
| 2007/0240758 A1* | 10/2007 | Spartz | B82Y 20/00 257/E31.037 |

(Continued)

FOREIGN PATENT DOCUMENTS

| | | |
|---|---|---|
| CN | 101515605 A | 8/2009 |
| CN | 102141009 A | 8/2011 |

(Continued)

OTHER PUBLICATIONS

KR20130123521 machine English translation (Year: 2013).*

(Continued)

*Primary Examiner* — Bach T Dinh
(74) *Attorney, Agent, or Firm* — Patterson + Sheridan, LLP

(57) ABSTRACT

A solar electrical generator comprising an outer wall (1, 2) arranged to partially surround a cavity. A hub (3) is provided within the cavity wherein the outer face (4) of the wall is provided with solar cells (5). At least one of the hub (3) and the inner face (6) of the wall are provided with solar cells (5).

16 Claims, 2 Drawing Sheets

(56) References Cited

U.S. PATENT DOCUMENTS

Figure 1:
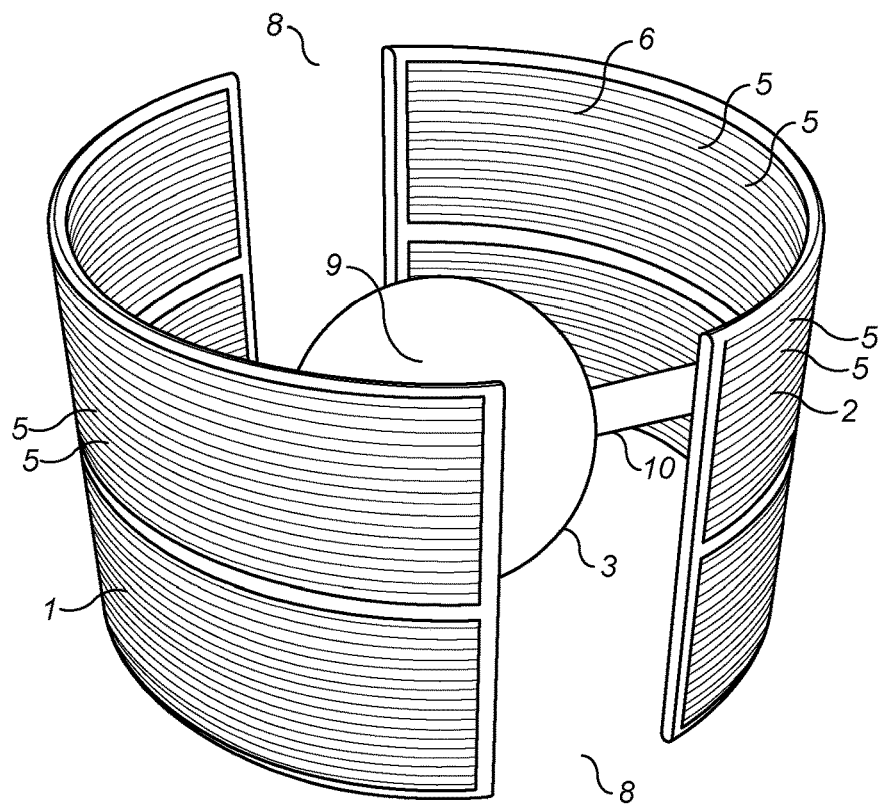

| | | | |
|---|---|---|---|
| 2010/0219762 A1* | 9/2010 | Brumels | H02S 20/10 362/183 |
| 2013/0264829 A1 | 10/2013 | Jordan, Sr. | |
| 2016/0258420 A1 | 9/2016 | Yamazawa | |
| 2017/0141721 A1 | 5/2017 | Schmidt | |

FOREIGN PATENT DOCUMENTS

| | | | |
|---|---|---|---|
| CN | 103811573 A | | 5/2014 |
| CN | 103825532 A | | 5/2014 |
| CN | 204089247 U | | 1/2015 |
| CN | 107339199 A | | 11/2017 |
| CN | 107642456 A | | 1/2018 |
| CN | 207368924 | * | 5/2018 |
| JP | H07-013840 Y2 | | 4/1995 |
| JP | 2001-189486 A | | 7/2001 |
| JP | 2003-083228 A | | 3/2003 |
| JP | 2004-068622 A | | 3/2004 |
| JP | 2008-088923 A | | 4/2008 |
| JP | 2008151053 A | | 7/2008 |
| JP | 2011155115 A | | 8/2011 |
| JP | 2011165772 A | | 8/2011 |
| JP | 2013-002268 A | | 1/2013 |
| JP | 2013-080845 A | | 5/2013 |
| JP | 2013191633 A | | 9/2013 |
| JP | 2014169671 A | | 9/2014 |
| JP | 2015-508633 A | | 3/2015 |
| KR | 20090051669 A | | 5/2009 |
| KR | 101124486 B1 | | 6/2012 |
| KR | 20130123521 | * | 11/2013 |
| KR | 20130123521 A | | 11/2013 |
| WO | 2012093896 A2 | | 7/2012 |
| WO | 2013/093909 A1 | | 6/2013 |
| WO | 2015/056722 A1 | | 4/2015 |
| WO | 2017149198 A1 | | 9/2017 |

OTHER PUBLICATIONS

CN207368924 machine English translation (Year: 2018).*
Australian Examination Report in related application AU 2019323747 dated Jun. 10, 2022.
Singapore Written Opinion in related application SG 11202101793U dated Jan. 12, 2022.
International Search Report and Written Opinion in related application PCT/GB2019/052335 dated Nov. 15, 2019.
Japanese Office Action issued in application JP2021-534831, dated Apr. 5, 2022.
Examination Report, in related application EP 19761931.5 dated Jan. 20, 2023.

* cited by examiner

SOLAR ELECTRICAL GENERATOR

The present invention relates to a solar electrical generator.

Solar electrical generators, more commonly referred to as solar panels, typically have a flat configuration which is orientated in a direction which maximises the ability to convert solar energy to electricity throughout the day. The panels are generally fixed such that they are only ever in the optimal angle for collecting solar energy for a few hours in the day.

The present invention aims at providing a design of solar electrical generator which can collect solar energy more efficiently so as to increase the amount of electrical energy which can be generated within a given footprint.

According to a first aspect of the present invention there is provided a solar electrical generator according to claim 1.

The design uses an outer wall defining a cavity, the outer face of which is provided with solar cells. The outer wall can be positioned such that there will always be some solar cells which are in the optimum position for energy conversion at any time of day/year. In addition, unlike a conventional panel, in the same footprint, the generator has a central cavity with a hub in which further solar cells are provided for further electrical generation.

By moving away from the planar geometry to this more complex geometry, initial tests have shown that we have been able to increase the amount of energy generated in a given footprint by around 300 to 500%.

The faces of the hub and the inner face of the wall which, in use, will be exposed to light may be provided with solar cells. In particular, the hub preferably has an upper face with solar cells.

However, at least one of the hub and the inner face of the outer wall may alternatively or additionally be provided with reflectors. These reflectors are preferably positioned to reflect some of the incident light toward a facing solar cell. The most effective power generation is achieved by maximum coverage of solar cells with the minimum coverage of reflectors. However, it is also the most costly option. The replacing of some of the solar cells with reflectors reduces the cost while still ensuring that power can be generated from the light which is incident on the reflectors. This provides a benefit in that it is possible, with a single general design, to produce a number of products which can be essentially made of the same components. However, for a low cost, relatively low power solution, a larger number of reflectors can be used in place of solar panels. On the other hand, if a higher cost, higher power output solution is required, a greater proportion of solar cells can be used.

The solar electrical generator is also readily scalable and can therefore meet a large number of applications. At the lower end, a small generator could be mounted, for example, above a remote piece of equipment which requires electricity but is not connected to the grid, such as a ticket machine in a car park or a telephone pole. In the middle of the range, a generator could have a maximum width of between 1 and 2 metres and a height of 1.5 to 2.5 metres. Such a generator could usefully be used in a domestic environment in order to recharge an electrical vehicle. The design has an aesthetically modern pleasing look in contrast to conventional solar panels which have a dull utilitarian appearance. At the top end of the scale, a number of large generators could be used in a solar farm.

The outer wall could be made of conventional solar panel material. In this case, a number of flat panels could be adjoined to one another. Preferably, however, the outer wall is formed of a curved frame to which a flexible solar fabric is attached. This can create a generally curved configuration and is also much lighter than a conventional solar panel material.

The generator may be arranged to directly provide power to a piece of external equipment such a ticket machine or vehicle described above. Preferably, however, the generator also incorporates power storage. This may conveniently be located within the hub and may take the form of a battery or a fly wheel. This provides an elegant design to generate and store power without requiring any external connections between the generator and the power storage.

The outer wall and the hub may be supplied separately from one another and mounted on the ground with the above defined spatial relationship. However, preferably, the outer wall is connected to the hub via one or more spokes thereby providing a unitary device in which the spatial relationships between the components are set prior to installation.

The outer wall partially surrounds the cavity such that light can enter the cavity either through the top or through the part of the cavity not surrounded by the wall. In practice, this means that there is at least one gap in the side wall. This may extend for part of the depth of the outer wall. However, preferably it extends for the full depth of the side wall.

The outer wall preferably subtends an angle of greater than 250° and more preferably greater than 280° at the hub. This ensures that the outer wall surrounds the vast majority of the hub to maximise the surface area of the outer convex faces. On the other hand, the outer wall preferably subtends an angle of greater than less than 320° at the hub. This still provides for a reasonable size gap to allow light to impinge upon the concave inner faces and the hub.

The outer wall is preferably provided by an outer wall arranged to partially surround a cavity, a first panel and a second panel, each panel having a concave inner face and a convex outer face, the panels being horizontally spaced so that the concave faces face one another thereby defining the central cavity.

There may be more than two panels, but the preference is for there to be two such panels which are diametrically opposed to one another to define a pair of gaps between respective adjacent ends of the panels.

The generator is preferably statically mounted as its shape provides the ability to collect solar energy in any orientation. Alternatively, it could be rotatably mounted about a vertical axis. This could allow the generator to position itself in the optimum position for a given location, or to rotate throughout the course of the day to optimise energy collection.

The solar cells on the outer wall may be fixed in a single position. However, preferably, at least part of the wall is movable from a first position into a second position in which its outer face is closer to a vertical plane. This allows at least some on the panels of the solar cells to be moved into a positon in which they can receive a greater amount of incident light at a particular time of day. For example, the second position could be used towards the middle of the day when the sun is directly overhead. Additionally or alternatively when the sun is low in the sky on one side of the generator, the part of the wall at the opposite side could be moved to the second position so that, again, a greater amount of light is incident on these panels.

The entire thickness of the wall may be movable between the first and second position for which would require some form of frame to support the wall in the various positions. However, preferably, the outer wall has an inner wall portion and an outer wall portion and the outer wall portion is movable while the inner portion is static.

The mechanism to move the movable part of the wall can be any suitable mechanism which will move the wall between the two positions. However, preferably, the movable part of the wall is rotatable about a substantially horizontal axis adjacent to its uppermost edge. The movable part of the outer wall may comprise only a single panel. However, preferably the movable outer wall portion comprises a plurality of movable panels. The movement of multiple panels as opposed to a single panel means that each individual panel extends to a relative limited arcuate extent such that each panel is able to be moved into a plane which is approximately horizontal.

The movable outer wall portion may be configured to be moved manually. Alternatively, the generator may be provided with sun tracking technology to optimise the position of the movable portion according to the position of the sun in the sky.

However, preferably, the generator has a timer to control movement of the movable part of outer wall portion. This is significantly cheaper than sun tracking technology whilst still allowing a significant degree of optimisation of the position of the movable outer wall portion.

The movability of at least part of the outer wall forms a second aspect of the present invention according to which there is provided a solar electrical generator according to claim 18. This generator may have any of the preferred features referred to above in relation to the first aspect of the invention.

In order to further enhance the power generating capabilities of the generator, the generator may further comprise one or more wind turbines. These may be of any suitable form but is preferably a multi-directional wind turbine, for example, a vertical axis "egg whisk" turbine or an O-wind turbine which is a multi-directional, generally spherical device.

Figure 2:
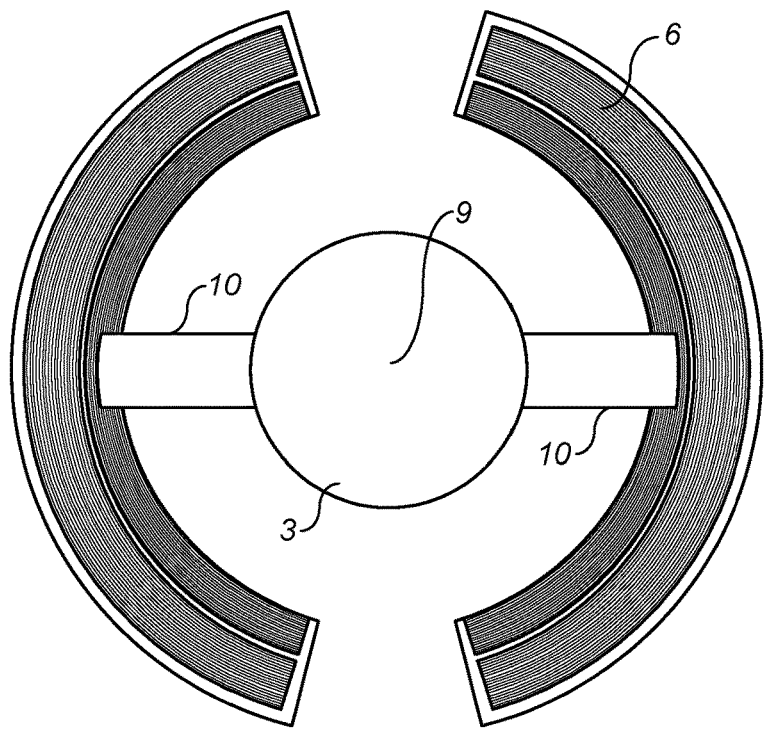
Figure 3:
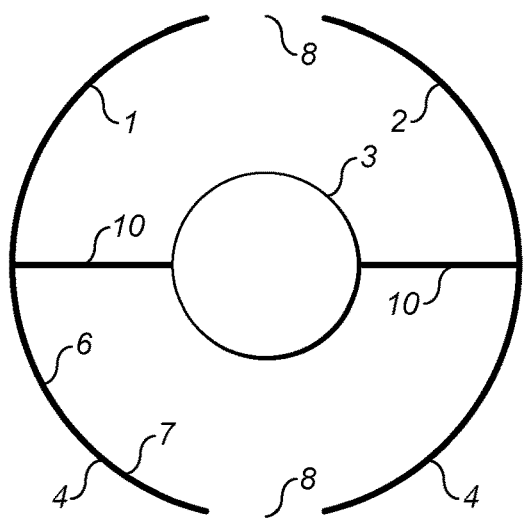
Figure 4:
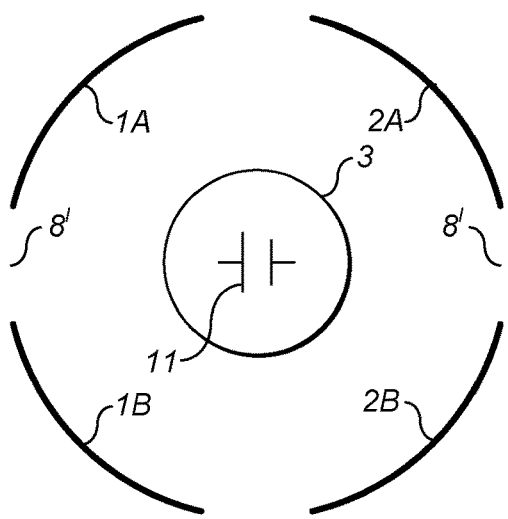
Figure 5:
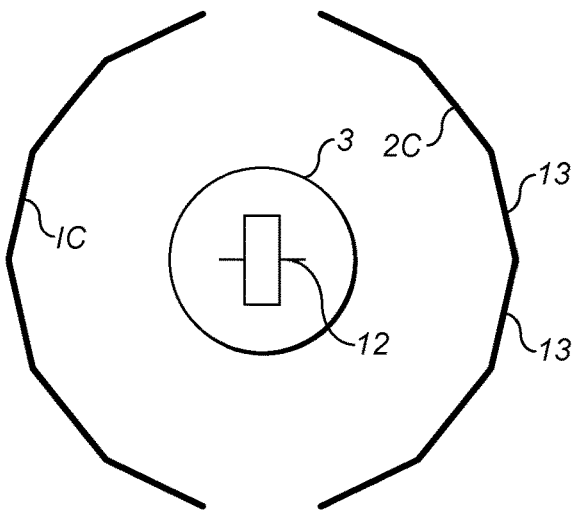
Figure 6:
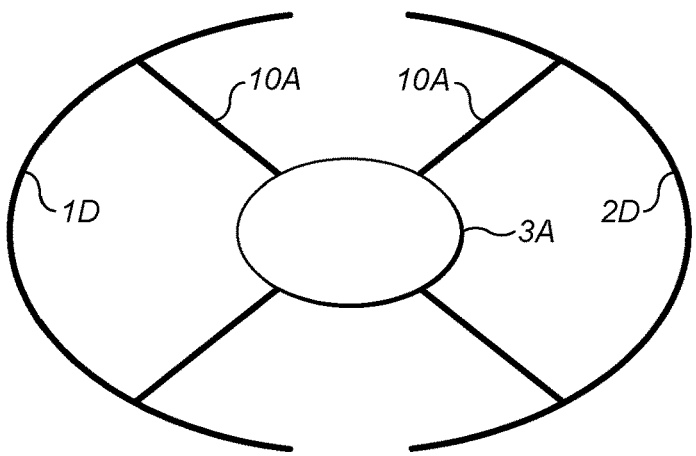

An example of a solar electrical generator in accordance with the present invention will now be described with reference to the accompanying drawings, in which:

FIG. 1 is a perspective view of a first generator;
FIG. 2 is a perspective top view of the first example;
FIG. 3 is a schematic plan view of the first generator; and
FIGS. 4 to 6 are schematic views of second, third and fourth examples of generators.

The generator consists of three main components, namely first 1 and second 2 solar panels and a central hub 3. The generator can be free-standing on the ground or may be mounted to a pole or other piece of equipment.

The two panels 1, 2 have the same construction and only one of these will be described below.

A significant proportion of each convex outer face 4 of each panel is covered with solar cells 5.

The concave inner face 6 of each of the panels may similarly be covered with solar cells 5. Alternatively or additionally, it may be covered in one or more reflectors 7.

The two curved panels 1, 2 are arranged generally concentrically such that they form a substantially cylindrical construction with a vertical axis. There are, however, a pair of gaps 8 formed between adjacent ends of the panels. In a preferred example, each of the curved panels subtends an angle of around 150° on each gap subtends of angle of around 30° at the hub. In use, it is intended that the generator will be mounted in an orientation with the gaps 8 facing in a direction to provide maximum power generation. This allows light to be incident on the inner concave faces 6 either through the top of the generator or through the gaps 8.

The hub 3 is shown with a spherical shape in FIGS. 1 and 2. This may have other shapes such as a cylinder or a dome.

In any event, it is preferred that the upwardly facing surface 9 of the hub is provided with solar cells. The peripheral surfaces which generally face the inner concave face 6 may either be provided with solar cells, reflectors or a combination of both. If the inner concave faces 6 are provided with reflectors, it would be preferable to provide more solar cells on the peripheral surface on the hub 3 as any light reflected from the inner concave face 6 will be concentrated on the peripheral face of the hub 3. On the other hand, if the inner concave face 6 is provided with a high proportion of solar cells, the periphery of the hub 3 may be provided with a high proportion of reflectors to reflect light onto the inner concave face 6. The exact arrangement of reflectors and cells can be determined through trial and error and may depend upon the local conditions. Nevertheless, the arrangement described offers a very efficient means of generating electricity in that there is always a part of the outer face 4 for which the solar cells 5 will be in the optimum position for any given time of day and year. The arrangement of the inner concave faces and hub also provides an efficient way of utilising the opposite face to the outer face 4 in a manner which can again receive a significant amount of solar energy again with surfaces at multiple different angles so that, again, there will often be solar cells which are in the optimal position to collect the energy at any particular time.

In the preferred example shown in FIGS. 1 to 3, the first 1 and second 2 curved panels are formed by producing a rigid curved frame. To this, a thin film flexible solar fabric can be applied. This is supplied on rolls and can be readily attached to the frame in order to form a very simple and lightweight structure. A second layer of thin film flexible solar fabric can be applied to the inner concave surface 6. In this case, this may not be applied fully across the surface, but instead, some of the regions may instead be provided with reflective material. A number of variations of this design are shown in FIGS. 4 to 6.

As an alternative to the arrangement shown in FIG. 1, the first and second panels may effectively be joined such that there is one large curved panel extending in a substantially C shape around the hub 3 with only a single gap 8.

The uppermost surface of the hub is preferably vertically positioned above the mid-point of the outer wall such that it is not unduly shaded by the outer wall. Preferably the maximum width of the hub is less than half and preferably less than one third of the maximum width of the cavity. This ensures that the hub does not unduly shade the inner face of the wall. The hub can be lower and, if so, its width can be increased as, the lower it is, the less it will shade the inner face of the wall. In a limiting case, the hub can effectively cover the base of the cavity. Another possibility is for a raised hub as described above with additional solar cells positioned across the base of the cavity.

In FIG. 4, each of the first 1 and second 2 curved panels is effectively split into two such that there are four separate panel 1A, 1B and 2A, 2B. This introduces two further gaps 8'. Again, the exact arrangement of panels and gaps can be determined experimentally and may vary depending on local conditions. There may, for example, be three or more panels and a corresponding number of gaps.

The arrangement shown in FIGS. 4 and 5 shows the panels 1, 2 separate from the hub 3. This may be suitable larger scale installations where the panels can be staked for transportation and assembled in situ. However, as shown in FIG. 3, the panels 1, 2 are connected to the hub 9 by a pair of spokes 10. There may be more than one spoke per panel, for example as shown at 10A in FIG. 6. The generator may either be pre-assembled in this configuration, which is more appropriate for small installations. Alternatively, the panels 1, 2 and hub 3 may still be transported separately and the spokes 10 assembled in situ to help fix the optimal geometrical relationships between the components.

As shown in FIG. 4, the hub 3 contains a battery 11 to store the energy generated by the solar cells. In FIG. 5, the energy storage is in the form of a fly wheel 12. The hubs 10, 10A provide a convenient connection between the solar cells 5 and the storage device 11, 12.

The third example of FIG. 5 shows a implementation with the invention more conventional solar panel technology in which a number of flat rigid panels 13 are connected together to form the panels 10, 2C. The inner faces of these panels may also be provided with solar cells or reflectors as previously described. The flat panels could equally be slightly separated from one another.

The previous examples show the first 1 and second 2 panels having an arcuate configuration centred around the centre of the hub 3. As shown in the third example of FIG. 6, the panels may deviate from an arcuate configuration and may, for example, have a parabolic or other non-circular shape as shown as 1D and 2D in the fourth example of FIG. 6.

As would be apparent from the above description, although a number of modifications having been incorporated into individual examples, individual modifications can be used in other examples. Thus, the presence or absence of spokes, the use of a power storage device within the hub, the use of more than two panels, the use of conventional flat panels or curved panels and the general shape of the panels may all be used independently of one another.

In a fifth example of a generator the hub is in the form of a curved panel which is titled upwardly towards one of gaps 8. However, the main new feature in the fifth example is that the first 1 and second 2 curved panels are formed of an inner wall and an outer wall, with the outer wall of each panel being made of three separate sections. There could, however, be more or less than three sections. Each of the sections is hinged at a point at the central region of its uppermost edge with respect to the inner wall.

The sections may be manually movable, but could also be motorised so as to be movable from the expanded configuration a retracted configuration in which all of the sections lie against the inner wall such that the generator resembles the generators described above in relation to the earlier examples. A timer is preferably provided to control the movement of the sections. The inwardly facing inner wall and the hub will remain in their fixed position and will function as before (although hub could optionally be mounted so as it be rotatable). When the sun is relatively low in the sky in the morning and evening, the sections are in the retracted configuration against the inner wall. However, in the middle part of the day when the sun is high in the sky, the sections are rotated into the expanded configuration such that the panels present a much a larger incident surface when the sun is at or close to a position directly above the generator.

The sections do not necessarily all need to be movable together. Instead, when the sun is relatively low in the sky, the sections which face the direction of the sun could be in the retracted position against the inner wall, while the other sections are rotated into the generally horizontal plane shown in the drawings, or even well beyond the horizontal plane such that they face in the general direction of the sun at this time.

In order to fully optimise the position of the sections, sun tracking technology could be employed. However, this is expensive and our intention is to use a timer to control the position of the sections as this provides a reasonable degree of optimisation of the position of the section for relatively little cost.

A sixth example of a generator is based on the generator of the fifth example, but this principal could apply to any of the previously described generators. In particular, a pair of wind turbines are attached to an upper edge of the panels 1, 2. Any suitable wind turbine design may be used. Such an arrangement is particularly useful when the generators are being used individually to produce power for a localised purpose such as charging a vehicle in a remote location. The use of one or more wind turbines under these circumstances provide a means of supplementing the power produced by the solar cells which should be particularly useful during winter months or on cloudy days when, although less solar energy will be available, it is likely that more wind energy can be harvested.

The invention claimed is:

1. A solar electrical generator comprising:
an outer wall arranged to partially surround a cavity, the outer wall extending around the cavity to define at least one gap such that light can enter the cavity either through a top of the cavity and through the at least one gap,
wherein an inner face of the outer wall and an outer face of the outer wall are provided with solar cells; and
a hub radially spaced from the outer wall and elevationally within the cavity with an upper face provided with solar cells within the cavity to receive light which has entered the cavity through the top of the cavity and through the at least one gap.

2. A generator according claim 1, wherein at least one of the hub and inner face of the outer wall are provided with a reflector.

3. A generator according to claim 1, wherein the outer wall is formed of a curved frame to which a flexible solar fabric is attached.

4. A generator according to claim 1, further comprising a power storage device within the hub.

5. A generator according to claim 1, wherein the outer wall is connected to the hub via one or more spokes.

6. A generator according to claim 1, wherein the outer wall subtends an angle of greater than 250° at the centre of the hub.

7. A generator according to claim 6, wherein the outer wall subtends an angle of greater than 280° at the centre of the hub.

8. A generator according to claim 1, wherein the outer wall subtends an angle of less than 320° at the centre of the hub.

9. A generator according to claim 1, wherein the outer wall is provided by a first panel and a second panel, each panel having a concave inner face and a convex outer face, the panels being horizontally spaced so that the concave faces face one another thereby defining the central cavity.

10. A generator according to claim 1, wherein the maximum width of the hub is less than half of the maximum width of the cavity.

11. A generator according to claim 10, wherein the maximum width of the hub is less than one third of the maximum width of the cavity.

12. A generator according to claim 1, wherein at least part of the outer wall is movable from a first position into a second position in which its outer face is closer to a vertical plane.

13. A generator according to claim 12, wherein the outer wall has an inner portion and an outer portion and the outer portion is movable, while the inner portion is static.

14. A generator according to claim 12, wherein the movable part of the outer wall is rotatable about a substantially horizontal axis adjacent to its uppermost edge.

15. A generator according to claim 12, wherein the movable part of the outer wall comprises a plurality of sections.

16. A generator according to claim 12, further comprising a timer to control the movement of the movable part of the wall.

\* \* \* \* \*